(12) United States Patent
Liou

(10) Patent No.: US 7,285,453 B2
(45) Date of Patent: Oct. 23, 2007

(54) TRIPLE WELL STRUCTURE AND METHOD FOR MANUFACTURING THE SAME

(75) Inventor: Jih-Wei Liou, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/474,022

(22) Filed: Jun. 23, 2006

(65) Prior Publication Data

US 2006/0237797 A1 Oct. 26, 2006

Related U.S. Application Data

(62) Division of application No. 10/994,130, filed on Nov. 19, 2004, now Pat. No. 7,122,867.

(51) Int. Cl.
*H01L 21/336* (2006.01)
*H01L 21/8234* (2006.01)
*H01L 21/8238* (2006.01)

(52) U.S. Cl. .................. 438/199; 438/200; 438/218; 257/E27.065; 257/E21.63

(58) Field of Classification Search ............... 438/199, 438/200, 218; 257/E27.065, E21.63
See application file for complete search history.

(56) References Cited

U.S. PATENT DOCUMENTS

| | | | |
|---|---|---|---|
| 6,320,232 B1 * | 11/2001 | Gossner et al. | 257/360 |
| 6,573,588 B1 * | 6/2003 | Kumamoto et al. | 257/532 |
| 6,979,869 B2 * | 12/2005 | Chen et al. | 257/356 |
| 2003/0053335 A1 * | 3/2003 | Hart et al. | 365/185.05 |
| 2004/0164354 A1 * | 8/2004 | Mergens et al. | 257/355 |
| 2005/0093073 A1 * | 5/2005 | Baird et al. | 257/360 |

\* cited by examiner

*Primary Examiner*—Ngân V. Ngô
(74) *Attorney, Agent, or Firm*—J.C. Patents

(57) ABSTRACT

The present invention discloses a triple well structure, which includes a substrate of a first conductive type, a deep buried well of a second conductive type, a well of a first conductive type, a well ring of a second conductive type, and a well ring of a first conductive type. The deep buried well of the second conductive type is in the substrate. The well of the first conductive type is disposed over the deep buried well of the second conductive type in the substrate. The well ring of the second conductive type surrounds the well of the first conductive type. The well ring of the first conductive type is between the well of the first conductive type and the well ring of the second conductive type.

5 Claims, 5 Drawing Sheets

TRIPLE WELL STRUCTURE AND METHOD FOR MANUFACTURING THE SAME

CROSS-REFERENCE TO RELATED APPLICATION

This application is a divisional application of, and claims the priority benefit of, U.S. application Ser. No. 10/994,130 filed on Nov. 19, 2004 now U.S. Pat. No. 7,122,867.

BACKGROUND OF THE INVENTION

1. Field of Invention

The present invention relates to a semiconductor structure and method for manufacturing the same. More particularly, the present invention relates to a triple well structure and method for manufacturing the same.

2. Description of Related Art

The combining of RF module, mixed signal function block and logic circuit has become a new trend for system on chip (SOC) application in current electronic industry. To avoid the impact of noise to the RF or analog block, triple well structure is usually adopted to isolate from outside devices in P-well or N-well.

A conventional triple well structure is formed on a P-type substrate. A P-type well is located in the P-type substrate under a transistor. A deep N-type well with high energy implant is formed in the P-type substrate under the P-type field. An N-type well ring is formed around the P-type well. The N-type well ring and the deep N-type well together surround the P-type well. The N-type well ring, the P-type well, and the deep N-type well together form a triple well structure. However, the noise signal around −20 db frequency range of interest would still damage the isolation property of a triple well structure.

Therefore, a triple well structure and method for manufacturing the same is required to improve the noise isolation and does not need any additional photolithograph process.

SUMMARY OF THE INVENTION

One object of the present invention is to provide a triple well structure capable of improving the noise isolation.

Another object of the present invention is to provide a method for manufacturing a semiconductor device with a triple well structure, whereby the noise isolation can be improved without any additional photolithograph process.

To at least achieve the above and other objects, the invention provides a triple well structure, which comprises a substrate of a first conductive type, a deep buried well of a second conductive type, a well of a first conductive type, a well ring of a second conductive type, and a well ring of a first conductive type. The deep buried well of the second conductive type is in the substrate. The well of first conductive type is disposed over the deep buried well of the second conductive type in the substrate. The well ring of the second conductive type surrounds the well of the first conductive type. The well ring of the first conductive type is between the well of the first conductive type and the well ring of the second conductive type.

The invention also provides a method for manufacturing a semiconductor device with a triple well structure. The method comprises defining a substrate of a first conductive type to include a first conductive type MOS section, a second conductive type MOS section and a triple well section. A first ion implantation process is performed to form a deep buried well of a second conductive type in the substrate of the triple well section. A second ion implantation process is then performed to form a first well of the first conductive type over the deep buried well of the second conductive type in the substrate of the triple well section. A third ion implantation process is performed to form a well ring of the second conductive type surrounding the first well of the first conductive type and to form a well of the second conductive type in the substrate of the first conductive type MOS section, simultaneously. A fourth ion implantation process is performed to form a well ring of the first conductive type between the first well of the first conductive type and the well ring of second conductive type in the triple well section and to form a second well of the first conductive type in the substrate of the second conductive type MOS section.

Since a well ring of the first conductive type between the well of the first conductive type and the well ring of the second conductive type with double implant dosage is added in the triple well structure, this triple well structure is able to improve the noise isolation. Moreover, the method for forming a triple well structure in the present invention can cooperate with the method for forming other device, so additional photolithograph process is not required.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
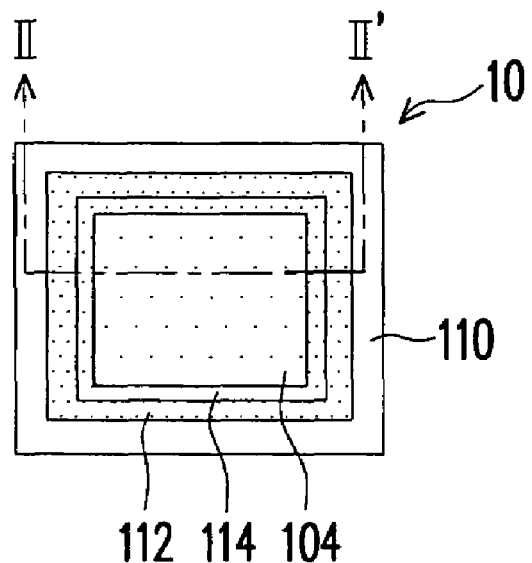
FIG. 1 is a top view of a triple well structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
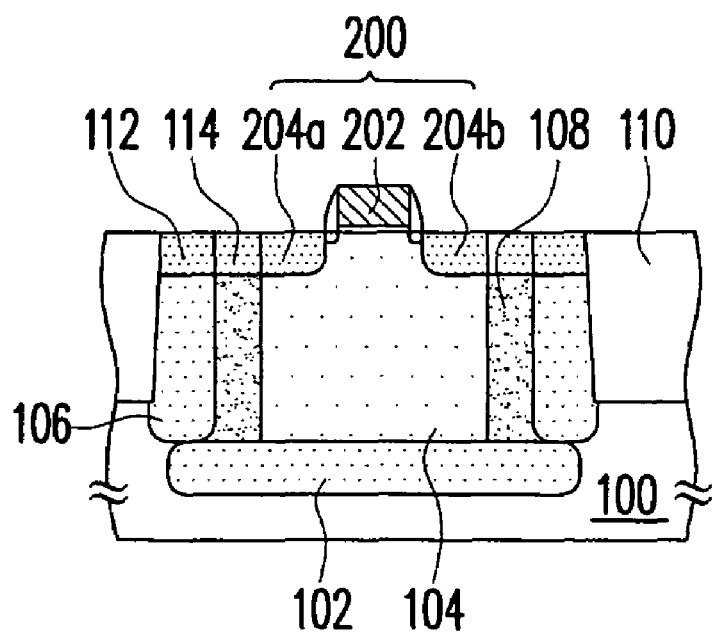
FIG. 2 is a schematic cross-sectional view through line II-II' as shown in FIG. 1.

FIG. 1 is a top view of a triple well structure according to one embodiment of the present invention. FIG. 2 is a schematic cross-sectional view through line II-II' as shown in FIG. 1.

Referring to FIG. 1 and FIG. 2, a triple well structure 10 includes a substrate 100 of a first conductive type, a deep buried well 102 of a second conductive type, a well 104 of a first conductive type, a well ring 106 of a second conductive type, and a well ring 108 of a first conductive type, wherein dopant concentration of the well ring 108 of the first conductive type is greater than that of the well 104 of the first conductive type. The deep buried well 102 of the second conductive type is in the substrate 100. The well 104 of the first conductive type is disposed over the deep buried well 102 of the second conductive type in the substrate 100. The well ring 106 of the second conductive type surrounds the well 104 of the first conductive type, and a bottom portion of the well ring 106 of the second conductive type optionally overlaps with a side portion of the deep buried well 102 of the second conductive type. The well ring 108 of the first conductive type is between the well 104 of the first conductive type and the well ring 106 of the second conductive type. Besides, the triple well structure 10 is usually separated by an isolation structure 110 from other device, for example. In one aspect, the triple well structure 10 further includes a heavily doped guard ring 112 of the second conductive type on the well ring 106 of the second conductive type around the well 104 of the first conductive type, and a heavily doped guard ring 114 of the first conductive type on the well ring 108 of the first conductive lo type around the well 104 of the first conductive type.

In another aspect, the first conductive type is N-type and the second conductive type is P-type.

In yet another aspect, the first conductive type is P-type and the second conductive type is N-type.

Referring to FIG. 2, the triple well structure 10 further includes a transistor 200. For example, the transistor 200 includes a gate structure 202 of the second conductive type on the substrate 100 of the first conductive type; a source 204a of the second conductive type and a drain 204b of the second conductive type on different sides of the gate structure 202 in the substrate 100 of the first conductive type.

FIGS. 3A-3G are schematic cross-sectional views of a process flow of manufacturing a semiconductor device with a triple well structure according to another embodiment of the present invention. Please note that the sequence of the following steps is not limited to that shown in the drawings but can be in a reverse order.

Figure 3A:
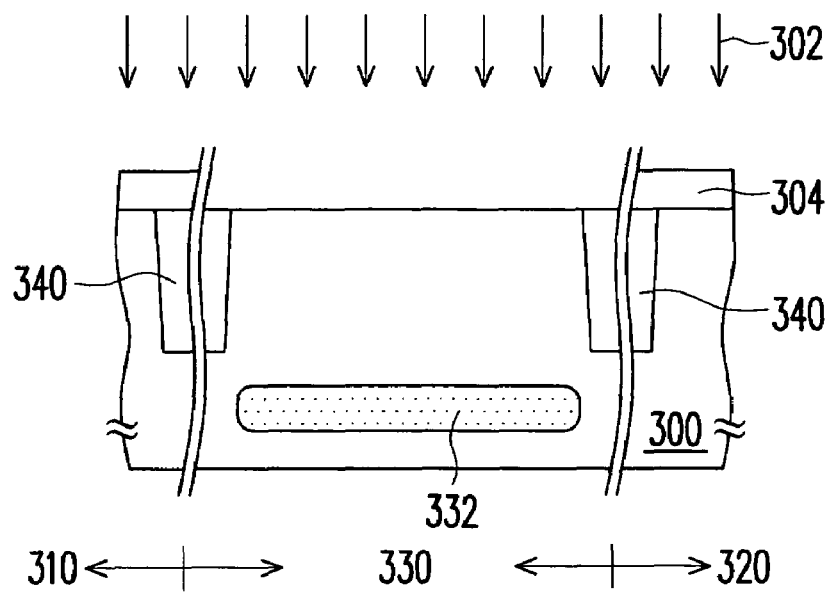
FIGS. 3A-3G are schematic cross-sectional views of a process flow of manufacturing a semiconductor device with a triple well structure according to another embodiment of the present invention.

Referring to FIG. 3A, a substrate 300 of the first conductive type is defined to include a first conductive type MOS section 310, a second conductive type MOS section 320 and a triple well section 330, wherein the triple well section 330 is usually separated by an isolation structure 340 from other device, for example. In one aspect, the first conductive type is N-type and the second conductive type is P-type. In another aspect, the first conductive type is P-type and the second conductive type is N-type. Thereafter, a first ion implantation process 302 is performed to form a deep buried well 332 of the second conductive type in the substrate 300 of the triple well section 330, wherein the first ion implantation process 302 can be performed by utilizing a first photoresist layer 304 as a mask, for example.

Figure 3B:
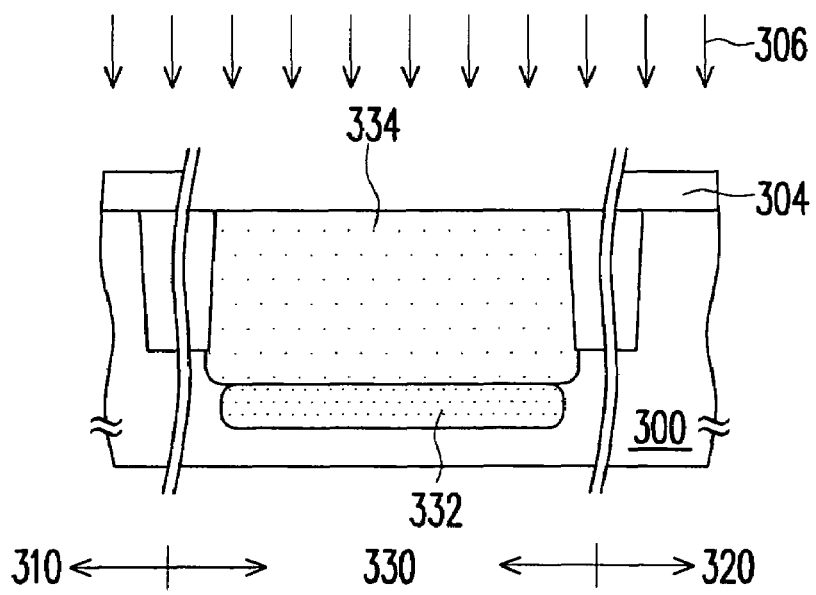

Referring to FIG. 3B, a second ion implantation process 306 is then performed to form a first well 334 of the first conductive type over the deep buried well 332 of the second conductive type in the substrate 300 of the triple well section 330, wherein the second ion implantation process 306 can be performed by utilizing the first photoresist layer 304 as a mask, for example.

Figure 3C:
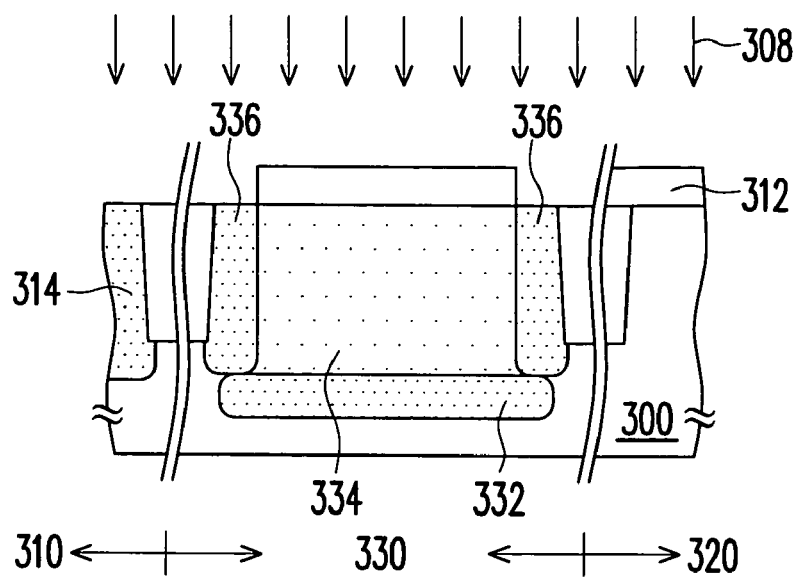

Referring to FIG. 3C, a third ion implantation process 308 is performed to form a well ring 336 of the second conductive type surrounding the first well 334 of the first conductive type, and a well 314 of the second conductive type is formed in the substrate 300 of the first conductive type MOS section 310 in the meantime. The third ion implantation process 308 can be performed by utilizing a second photoresist layer 312 as a mask, for example.

Figure 3D:
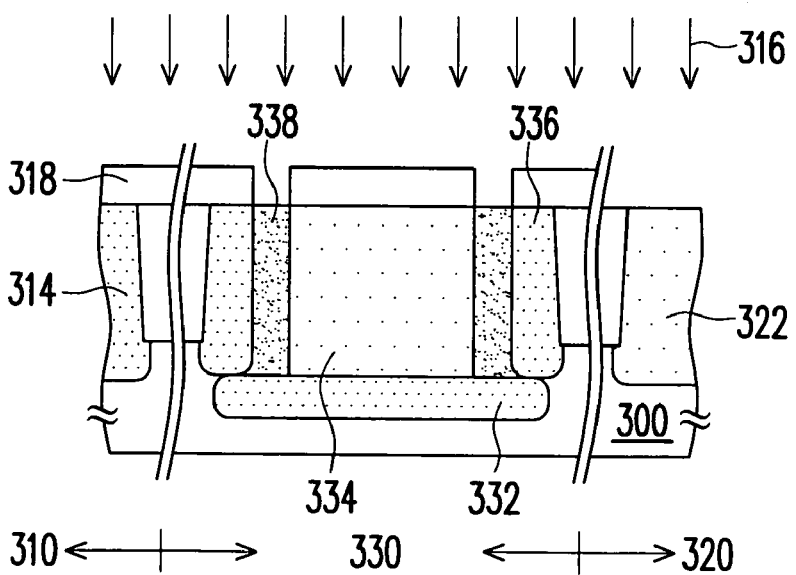

Referring to FIG. 3D, a fourth ion implantation process 316 is performed to form a well ring 338 of the first conductive type between the first well 334 of the first conductive type and the well ring 336 of the second conductive type in the triple well section 330, and a second well 322 of the first conductive type is simultaneously formed in the substrate 300 of the second conductive type MOS section 320. The fourth ion implantation process 316 can be performed by utilizing a third photoresist layer 318 as a mask, for example.

Figure 3E:
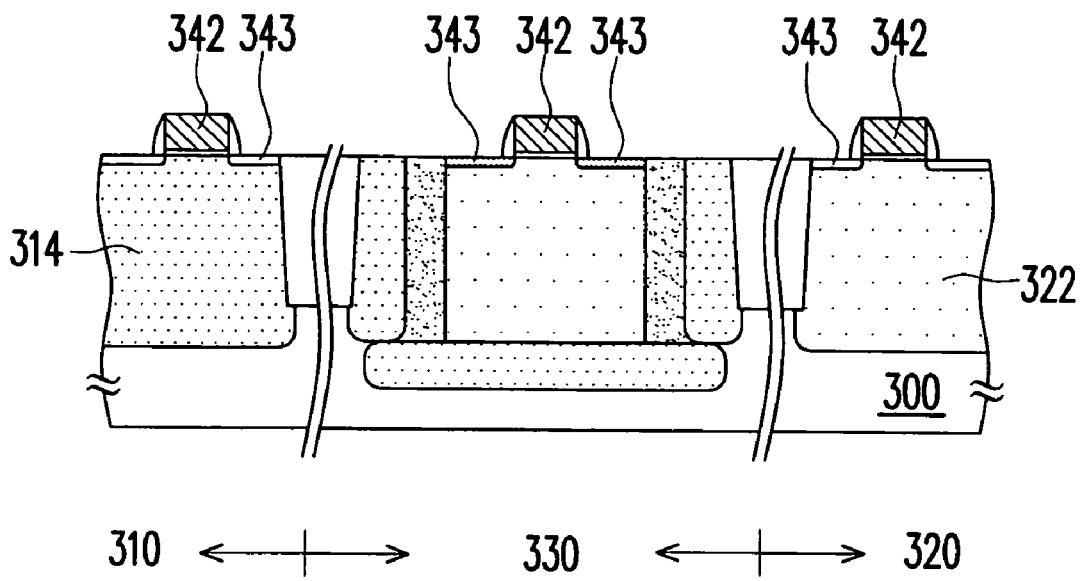

Referring to FIG. 3E, a plurality of gate structures 342 are formed on the first well 334 of the first conductive type, the well 314 of the second conductive type, and the second well 322 of the first conductive type, for example. Further, multiple lightly doped drain (LDD) regions 343 are optionally formed in the substrate 300 on different sides of the gate structure 342 after the gate structures 342 are formed.

Figure 3F:
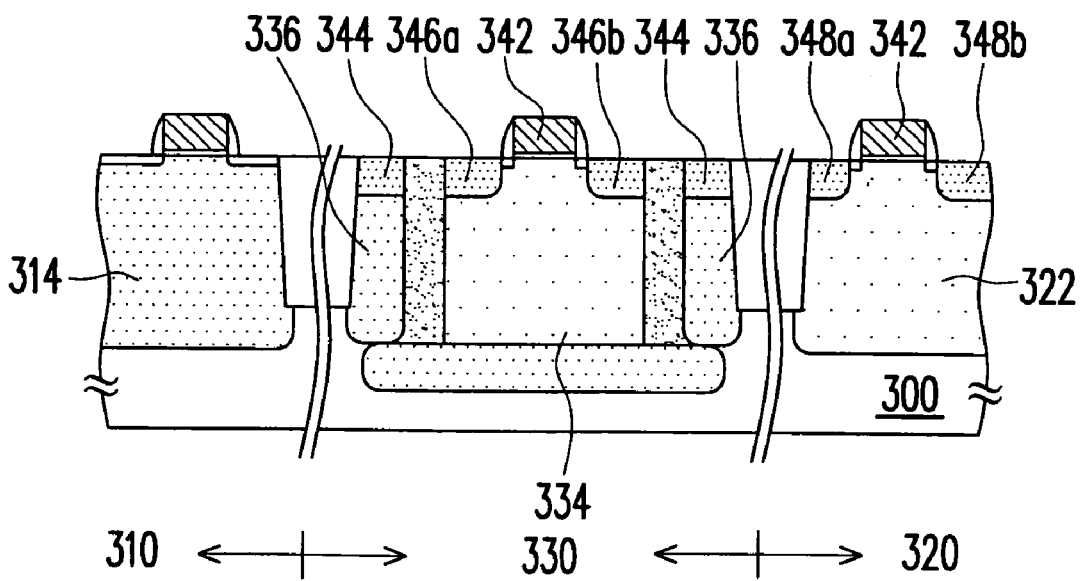

Referring to FIG. 3F, a fifth ion implantation process is performed to form a heavily doped guard ring 344 of the second conductive type on the well ring 336 of the second conductive type surrounding the first well 334 of first conductive type; meanwhile, a first source 346a of the second conductive type and a first drain 346b of the second conductive type are formed on different sides of the gate structure 342 on the first well 334 of the first conductive type, and a second source 348a of the second conductive type and a second drain 348b of the second conductive type are formed on different sides of the gate structure 342 on the second well 322 of the first conductive type, respectively.

Figure 3G:
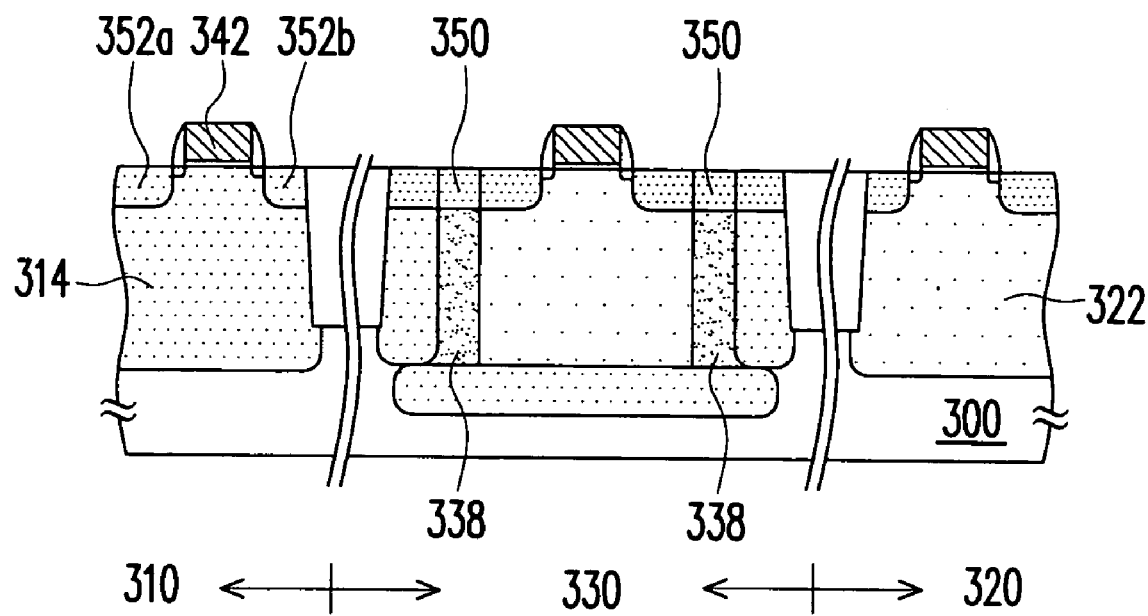

Referring to FIG. 3G, a sixth ion implantation process is performed to form a heavily doped guard ring 350 of the first conductive type on the well ring 338 of the first conductive type, and to form a source 352a of the first conductive type and a drain 352b of the first conductive type on different sides of the gate structure 342 on the well 314 of the second conductive type, simultaneously.

According to foregoing descriptions, the well ring of the first conductive type between the well of the first conductive type and the well ring of the second conductive type with double implant dosage is utilized as a low-resistance node that helps to transmit the signal interference to ground pad. Therefore, the triple well structure according to the invention is capable of improving the noise isolation. Further, the method for manufacturing a semiconductor device with a triple well structure according to the invention is able to improve the isolation without any additional photolithograph process.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a semiconductor device with a triple well structure, the method comprising:

defining a substrate of first conductive type to include a first conductive type MOS section, a second conductive type MOS section and a triple well section;

performing a first ion implantation process to form a deep buried well of the second conductive type in the substrate of the triple well section;

performing a second ion implantation process to form a first well of the first conductive type over the deep buried well of the second conductive type in the substrate of the triple well section;

performing a third ion implantation process to form a well ring of the second conductive type surrounding the first well of the first conductive type and to form a well of the second conductive type in the substrate of the first conductive type MOS section, simultaneously; and performing a fourth ion implantation process to form a well ring of the first conductive type between the first well of the first conductive type and the well ring of the second conductive type in the triple well section and to form a second well of the first conductive type in the substrate of the second conductive type MOS section.

2. The method of claim 1, further comprising:

forming a plurality of gate structures on the first well of the first conductive type, the well of the second conductive type, and the second well of the first conductive type;

performing a fifth ion implantation process to form a heavily doped guard ring of the second conductive type on the well ring of the second conductive type surrounding the first well of the first conductive type, to form a first source of the second conductive type and a first drain of the second conductive type on different sides of the gate structure on the first well of the first conductive type, and to form a second source of the second conductive type and a second drain of the second conductive type on different sides of the gate structure on the second well of the first conductive type, respectively; and performing a sixth ion implantation process to form a heavily doped guard ring of the first conductive type on the well ring of the first conductive type, and to form a source of the first conductive type and a drain of the first conductive type on different sides of the gate structure on the well of the second conductive type, respectively.

3. The method of claim 2, wherein after the step of forming the plurality of gate structures, the method further comprising forming a plurality of lightly doped drain (LDD) regions in the substrate on different sides of the plurality of gate structures.

4. The method of claim 1, wherein the first conductive type is N-type and the second conductive type is P-type.

5. The method of claim 1, wherein the first conductive type is P-type and the second conductive type is N-type.

* * * * *